United States Patent
Kim et al.

(10) Patent No.: US 7,709,356 B2
(45) Date of Patent: May 4, 2010

(54) METHODS OF FORMING A PATTERN AND METHODS OF MANUFACTURING A MEMORY DEVICE USING THE SAME

(75) Inventors: Min-Sang Kim, Seoul (KR); Sung-Young Lee, Yongin-si (KR); Sung-Min Kim, Incheon (KR); Eun-Jung Yun, Seoul (KR); In-Hyuk Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 643 days.

(21) Appl. No.: 11/605,266

(22) Filed: Nov. 29, 2006

(65) Prior Publication Data

US 2008/0081442 A1 Apr. 3, 2008

(30) Foreign Application Priority Data

Oct. 2, 2006 (KR) .................. 10-2006-0097137

(51) Int. Cl.
*H01L 21/00* (2006.01)
(52) U.S. Cl. .................. 438/478; 438/479; 438/481
(58) Field of Classification Search ......... 438/478–479, 438/481
See application file for complete search history.

(56) References Cited

U.S. PATENT DOCUMENTS

| | | | | |
|---|---|---|---|---|
| 5,143,862 | A * | 9/1992 | Moslehi | 438/413 |
| 5,321,298 | A * | 6/1994 | Moslehi | 257/506 |
| 6,780,725 | B2 * | 8/2004 | Fujimaki | 438/313 |
| 7,449,767 | B2 * | 11/2008 | Cohen et al. | 257/627 |
| 7,537,980 | B2 * | 5/2009 | Son et al. | 438/151 |
| 7,579,262 | B2 * | 8/2009 | Hoentschel et al. | 438/478 |
| 7,595,246 | B2 * | 9/2009 | Kang et al. | 438/300 |
| 2002/0000610 | A1 * | 1/2002 | Jang et al. | 257/330 |
| 2006/0240655 | A1 * | 10/2006 | Lee | 438/590 |
| 2007/0007532 | A1 * | 1/2007 | Kang et al. | 257/67 |
| 2007/0015346 | A1 * | 1/2007 | Cohen et al. | 438/481 |
| 2007/0048913 | A1 * | 3/2007 | Son et al. | 438/151 |

(Continued)

FOREIGN PATENT DOCUMENTS

JP 2003-197731 7/2003

(Continued)

*Primary Examiner*—Laura M Menz
(74) *Attorney, Agent, or Firm*—Harness, Dickey & Pierce, P.L.C.

(57) ABSTRACT

In a method of forming a pattern, a sacrificial layer pattern and a stop layer pattern for preventing or reducing an epitaxial growth may be formed on a substrate. The sacrificial layer pattern may have a first hole therethrough, and the first hole partially exposes a top surface of the substrate. At least one active pattern may be formed on a bottom and a sidewall of the first hole by performing a selective epitaxial growth process on the top surface of the substrate and a sidewall of the sacrificial layer pattern. The sacrificial layer pattern and the stop layer pattern for preventing or reducing the epitaxial growth may be removed from the substrate. The at least one active pattern formed by the above method may have a finer size and an improved shaped compared to a conventional active pattern formed by directly patterning layers using a photoresist pattern. Damages in a photolithography process may be prevented or reduced from being generated.

9 Claims, 8 Drawing Sheets

U.S. PATENT DOCUMENTS

| | | | |
|---|---|---|---|
| 2007/0134880 A1* | 6/2007 | Kang et al. | 438/300 |
| 2008/0023770 A1* | 1/2008 | Kim et al. | 257/365 |
| 2008/0048221 A1* | 2/2008 | Lee | 257/292 |
| 2008/0081442 A1* | 4/2008 | Kim et al. | 438/478 |
| 2008/0128748 A1* | 6/2008 | Iinuma | 257/190 |
| 2008/0293222 A1* | 11/2008 | Chiang et al. | 438/478 |
| 2009/0085163 A1* | 4/2009 | Russ et al. | 257/594 |

FOREIGN PATENT DOCUMENTS

| | | |
|---|---|---|
| KR | 1020010003417 A | 1/2001 |
| KR | 10-0365738 | 12/2002 |

* cited by examiner

US 7,709,356 B2

METHODS OF FORMING A PATTERN AND METHODS OF MANUFACTURING A MEMORY DEVICE USING THE SAME

PRIORITY STATEMENT

This application claims priority under 35 USC § 119 to Korean Patent Application No. 2006-97137, filed on Oct. 2, 2006, in the Korean Intellectual Property Office (KIPO), the entire contents of which are herein incorporated by reference.

BACKGROUND

1. Field

Example embodiments relate to methods of forming a pattern and methods of manufacturing a memory device using the same. Example embodiments relate to methods of forming an active pattern by an epitaxial growth process and methods of manufacturing a memory device using the method of forming the active pattern.

2. Description of the Related Art

Generally, non-volatile memory devices are classified into floating gate type memory devices and/or floating trap type memory devices. A silicon-oxide-nitride-oxide-semiconductor (SONOS) memory device may serve as the floating trap type memory device. The SONOS memory device may include a tunnel insulation layer formed on a semiconductor substrate, a charge trapping layer, a blocking insulation layer and a gate electrode. The tunnel insulation layer may include silicon oxide, the charge trapping layer may include silicon nitride, the blocking insulation layer may include silicon oxide, and the gate electrode may include a conductive material. The SONOS memory device may perform programming tasks by storing electrons in a trap site formed in the charge trapping layer, which is disposed between the gate electrode and the semiconductor substrate, and erasing tasks by storing holes in the trap site formed in the charge trapping layer.

The tunnel insulation layer may be formed to have a relatively small thickness because the electrons and/or the holes may be stored in the trap site of the charge trapping layer. The SONOS memory device may be operated even by a lower operation voltage so that a structure of a peripheral circuit may be simplified. The SONOS memory device may have an increased integration degree.

Recently, a width between isolation regions for isolating memory cells has been decreased as a design rule of the memory cells is reduced. The isolation regions may be formed by forming a photoresist pattern on a substrate, etching the substrate using the photoresist pattern as an etching mask to form a trench at upper portions of the substrate, and filling the trench with an insulator.

Forming the isolation regions using the photoresist pattern may become a challenging task because the design rule of the memory cells has become smaller. As a critical dimension (CD) of the photoresist pattern gets finer, a thickness of the photoresist pattern may get smaller, and thus etching the substrate using the photoresist pattern may result in being more difficult. The photoresist pattern may be fine enough that the photoresist pattern may be broken. Accordingly, a roughness of a side face of the photoresist pattern may not be uniform, thereby disfiguring a shape of the trench that may be successively formed by the etching process.

SUMMARY

Example embodiments provide methods of forming an active pattern, wherein the active pattern may have a uniform CD. Example embodiments provide methods of manufacturing a memory device using the methods of forming the active pattern, wherein the active pattern may have the uniform CD.

According to example embodiments, there is provided a method of forming an active pattern. In the method of forming the active pattern, a sacrificial layer pattern and a stop layer pattern for preventing or reducing an epitaxial growth may be formed on a substrate. The sacrificial layer pattern may have a first hole therethrough, and the first hole may partially expose a top surface of the substrate. At least one active pattern may be formed on a bottom and a sidewall of the first hole by performing a selective epitaxial growth (SEG) process on the top surface of the substrate and a sidewall of the sacrificial layer pattern. The sacrificial layer pattern and the stop layer pattern for preventing or reducing the epitaxial growth may be removed from the substrate.

In example embodiments, the substrate may include single crystalline silicon and the active pattern may include single crystalline silicon. In example embodiments, a thickness of the at least one active pattern may be substantially the same as a width of the sacrificial layer pattern. In example embodiments, a ratio between the thickness of the at least one active pattern and a width of the first hole may be about 1:3. In example embodiments, the stop layer pattern may be formed using an oxide and/or a nitride.

In example embodiments, the sacrificial layer pattern may be removed using an etchant having an etching selectivity that may be between those of the sacrificial layer pattern and the at least one active pattern. In example embodiments, the etchant may include peracetic acid ($C_2H_4O_3$). In example embodiments, forming the sacrificial layer pattern may include forming a sacrificial layer on the substrate by an epitaxial growth process, forming a stop layer for preventing or reducing an epitaxial growth on the sacrificial layer, forming a mask pattern on the stop layer for preventing or reducing the epitaxial growth to partially expose the stop layer and partially removing the stop layer and the sacrificial layer by an etching process using the mask pattern as an etching mask.

According to example embodiments, there is provided a method of forming an active pattern. In the method of forming the active pattern, a sacrificial layer pattern and a stop layer pattern for preventing or reducing an epitaxial growth may be formed on a substrate. The sacrificial layer pattern may have a first hole therethrough, and the first hole may partially expose a first top surface portion of the substrate. A first active layer may be formed on a bottom and a sidewall of the first hole by performing a first SEG process on the first top surface portion of the substrate and a sidewall of the sacrificial layer pattern.

A second hole may be formed within the first hole while the SEG process is performed, and may have a width smaller than that of the first hole. An insulation layer pattern may be formed to sufficiently fill the second hole. A third hole may be formed by removing the sacrificial layer pattern and the stop layer pattern for preventing or reducing the epitaxial growth. A second active layer may be formed on a bottom and a sidewall of the third hole by performing a second SEG process on a second top surface portion of the substrate and a sidewall of the first active layer to form at least one active pattern including the first and the second active layers. The second top surface portion of the substrate may be exposed by the third hole.

In example embodiments, the substrate may include single crystalline silicon and the active pattern may include single crystalline silicon. In example embodiments, a ratio between a width of the first hole and that of the sacrificial layer pattern may be about 1:1. In example embodiments, a ratio between a width of the second hole and that of the at least one active pattern may be about 1:1. In example embodiments, the stop layer pattern may be formed using an oxide and/or a nitride. In example embodiments, forming the insulation layer pattern may include forming an insulation layer on the stop layer pattern and the first active layer to sufficiently fill the second hole, and planarizing the insulation layer until a top surface of the stop layer pattern may be exposed.

According to example embodiments, there is a method of manufacturing a memory device. In the method of manufacturing the memory device, the method of forming the active pattern according to example embodiments may be performed, wherein the at least one active pattern is a plurality of active patterns. An insulation layer pattern may be formed on the substrate to fill spaces between the plurality of active patterns. A tunnel oxide layer, a charge trapping layer, a blocking insulation layer and a gate conductive layer may be formed on the plurality of active patterns and the insulation layer pattern.

In example embodiments, after forming the insulation layer pattern, the method may further include partially removing the insulation layer pattern to expose top surfaces of the plurality of active patterns. In example embodiments, the method may further include forming a mask pattern extending in a direction substantially perpendicular to a direction in which the plurality of active patterns extend on the gate conductive layer, partially removing the gate conductive layer, the blocking insulation layer, the charge trapping layer and the tunnel oxide layer by an etching process using the mask pattern as an etching mask to form a memory cell on the plurality of active patterns and the insulation layer pattern and implanting impurities onto top surface portions of the plurality of active patterns using the gate electrode as an implantation mask to form a source region and a drain region in the plurality of active patterns.

According to example embodiments, there is a method of manufacturing a memory device. In the method of manufacturing the memory device, the method of forming the active pattern according to example embodiments may be performed, wherein the insulation layer pattern is a first insulation layer pattern and the at least one active pattern is a plurality of active patterns. A second insulation layer pattern may be formed on the substrate to fill spaces between the plurality of active patterns. A tunnel oxide layer, a charge trapping layer, a blocking insulation layer and a gate conductive layer may be formed on the plurality of active patterns and the first and the second insulation layer patterns.

In example embodiments, after forming the second insulation layer pattern, the method may further include partially removing the second insulation layer pattern to expose top surfaces of the plurality of active patterns. In example embodiments, the method may further include forming a mask pattern extending in a direction substantially perpendicular to a direction in which the plurality of active patterns extend on the gate conductive layer; partially removing the gate conductive layer, the blocking insulation layer, the charge trapping layer and the tunnel oxide layer by an etching process using the mask pattern as an etching mask to form a memory cell on the plurality of active patterns and the first and the second insulation layer patterns; and implanting impurities onto top surface portions of the plurality of active patterns using the gate electrode as an implantation mask to form a source region and a drain region in the plurality of active patterns.

According to example embodiments, a method of forming an active pattern may include forming a sacrificial layer pattern and a stop layer pattern for reducing an epitaxial growth on a substrate, wherein the sacrificial layer pattern includes a first hole therethrough, and wherein the first hole partially exposes a first top surface of the substrate, forming at least one active layer on a bottom and a sidewall of the first hole by performing a first selective epitaxial growth (SEG) process on the first top surface of the substrate and a sidewall of the sacrificial layer pattern and removing the sacrificial layer pattern and the stop layer pattern for reducing the epitaxial growth from the substrate.

The at least one active layer may be two active layers forming at least one active pattern. A second hole may be formed within the first hole while the first SEG process is performed and has a width smaller than that of the first hole. Removing the sacrificial layer pattern and the stop layer pattern may include forming a third hole. After forming at least one active layer, the method may further include forming an insulation layer pattern to sufficiently fill the second hole. After removing the sacrificial layer pattern and the stop layer pattern, the method may further include forming a second active layer on a bottom and a sidewall of the third hole by performing a second SEG process on a second top surface portion of the substrate and a sidewall of the first active layer to form the at least one active pattern, wherein the second top surface portion of the substrate is exposed by the third hole.

According to example embodiments, a method of manufacturing a memory device may include performing the method of forming the active pattern according to example embodiments, wherein the at least one active pattern is a plurality of active patterns, forming at least one insulation layer pattern on the substrate to fill spaces between the plurality of active patterns and forming a tunnel oxide layer, a charge trapping layer, a blocking insulation layer and a gate conductive layer on the plurality of active patterns and the at least one insulation layer pattern.

According to example embodiments, an active pattern may be formed to have a finer size and an improved shape compared to a conventional active pattern formed by directly patterning layers using a photoresist pattern. The active pattern may not have the problems generated when the conventional active pattern is formed using the photoresist pattern.

BRIEF DESCRIPTION OF THE DRAWINGS

Example embodiments will be more clearly understood from the following detailed description taken in conjunction with the accompanying drawings.

FIGS. 1 to 6 are diagrams illustrating a method of forming a pattern in accordance with example embodiments;

FIGS. 7 to 10 are diagrams illustrating a method of forming a pattern in accordance with example embodiments;

FIGS. 11 to 12 are diagrams illustrating a method of manufacturing a memory device using the method of forming the pattern illustrated with reference to FIGS. 1 to 6; and FIGS. 13 to 15 are diagrams illustrating a method of manufacturing a memory device using the method of forming the pattern illustrated with reference to FIGS. 1 to 6.

DESCRIPTION OF EXAMPLE EMBODIMENTS

Figure 1:
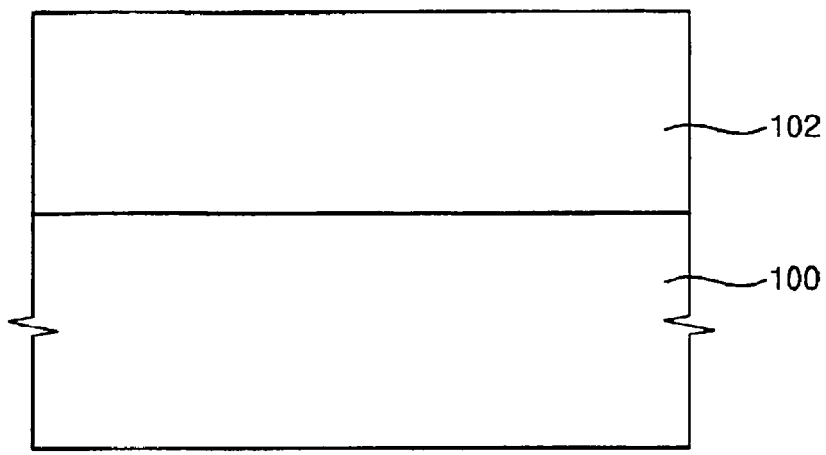
FIGS. 1-15 represent non-limiting, example embodiments as described herein.

Example embodiments are described more fully hereinafter with reference to the accompanying drawings, in which example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of forming a pattern in accordance with example embodiments will be explained in detail with reference to the accompanying drawings. FIGS. 1 to 6 are diagrams illustrating a method of forming a pattern in accordance with example embodiments. Referring to FIG. 1, a sacrificial layer 102 may be formed on a semiconductor substrate 100 by an epitaxial growth process. In example embodiments, the sacrificial layer 102 may be formed using silicon-germanium.

The semiconductor substrate 100 may be formed using single crystalline silicon, and the sacrificial layer 102 may be formed into a silicon-germanium layer using the single crystalline silicon included in the semiconductor substrate 100 as an epitaxial growth seed. Hereinafter, the epitaxial growth process in accordance with example embodiments will be described in detail. After the semiconductor substrate 100 is loaded into a reaction chamber (not shown), the reaction chamber may be heated to a temperature of about 150° C. to about 400° C., and a silicon source gas and a germanium source gas may be introduced into the reaction chamber.

Examples of the silicon source gas may be silane gas ($SiH_4$), tetramethylsilane gas ($Si(CH_3)_4$), tetraethylsilane gas ($Si(C_2H_5)_4$) and/or tetrakis-silane gas ($Si(N(CH_3)_2)_4$), and examples of the germanium source gas may be germane gas ($GeH_4$), tetramethylgermane gas ($Ge(CH_3)_4$), tetraethylgermane gas ($Ge(C_2H_5)_4$) and/or tetrakis-germane gas ($Ge(N(CH_3)_2)_4$). The sacrificial layer 102 may be formed on the semiconductor substrate 100 using the single crystalline silicon included in the semiconductor substrate 100 as an epitaxial seed while the silicon source gas and the germanium source gas are introduced into the reaction chamber.

Figure 2:
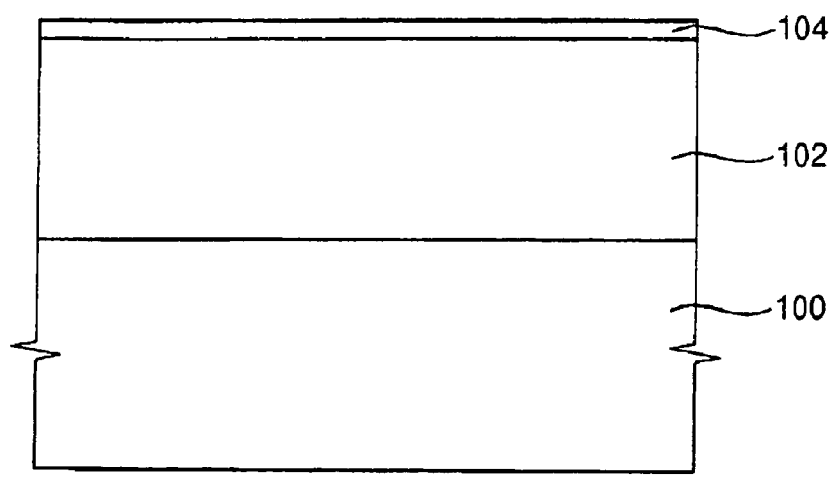

Referring to FIG. 2, a stop layer 104 for preventing or reducing an epitaxial growth may be formed on the sacrificial layer 102. The stop layer 104 for preventing or reducing the epitaxial growth may be formed using an oxide and/or a nitride. In example embodiments, the stop layer 104 may be formed using the oxide by a thermal oxidation process and/or a chemical vapor deposition (CVD) process. The stop layer 104 may prevent or reduce the single crystalline silicon included in the semiconductor substrate 100 from growing on and/or over the sacrificial layer 102 in a selective epitaxial growth (SEG) process that is successively performed. The SEG process will be described later in detail.

Figure 3:
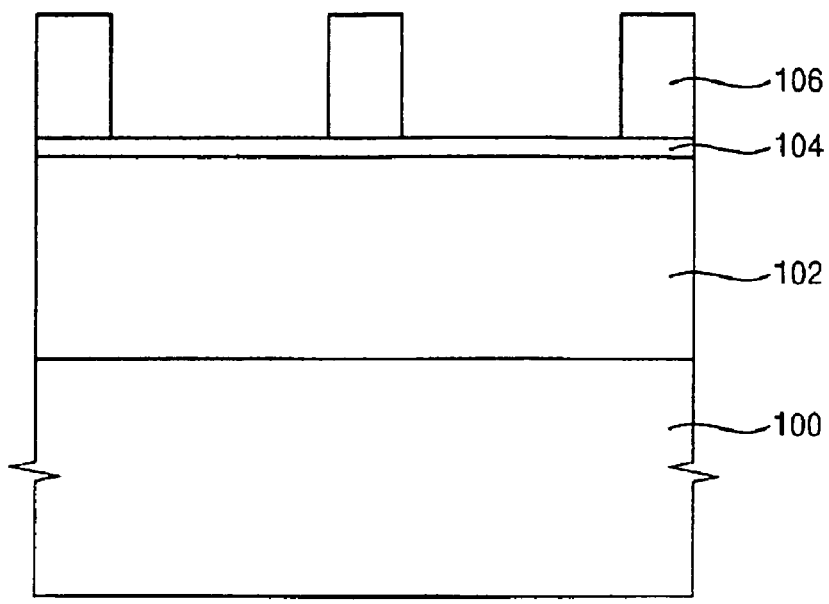

Referring to FIG. 3, a mask pattern 106 may be formed on the stop layer 104 to cover a first top surface portion of the stop layer 104 and may expose a second top surface portion of the stop layer 104. The mask pattern 106 may be formed using a photoresist pattern. In example embodiments, a ratio between a width of the first top surface portion and that of the second top surface portion may be about 1:3.

Figure 4:
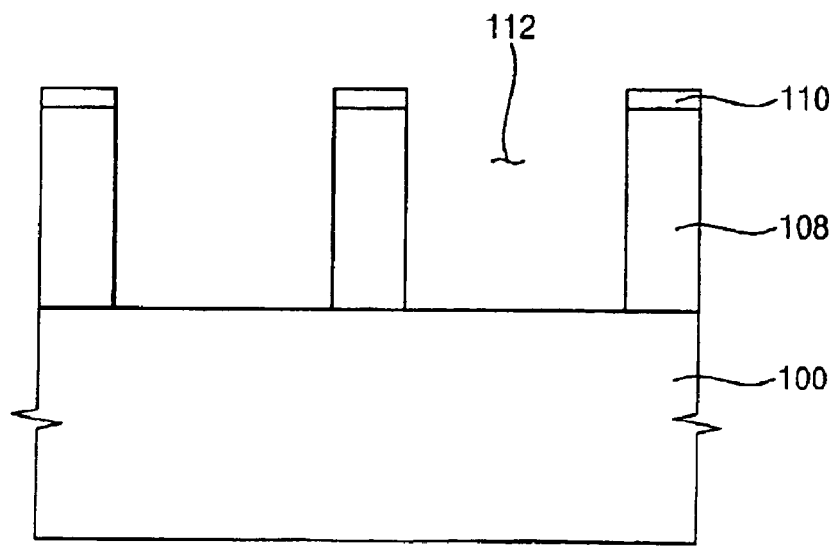

Referring to FIG. 4, the stop layer 104 and the sacrificial layer 102 may be partially removed using the mask pattern 106 as an etching mask to form a sacrificial layer pattern 108 and a stop layer pattern 110 for preventing or reducing an epitaxial growth that are sequentially stacked on the semiconductor substrate 100. The sacrificial layer pattern 108 for preventing or reducing the epitaxial growth may have a first hole 112 therethrough, which partially exposes a top surface of the semiconductor substrate 100 while the stop layer 104 and the sacrificial layer 102 are partially removed. The mask pattern 106 may be removed after forming the sacrificial layer pattern 108 and the stop layer pattern 110 thereon. When the mask pattern 106 is a photoresist pattern, the photoresist pattern may be removed by an ashing process and/or a stripping process.

Figure 5:
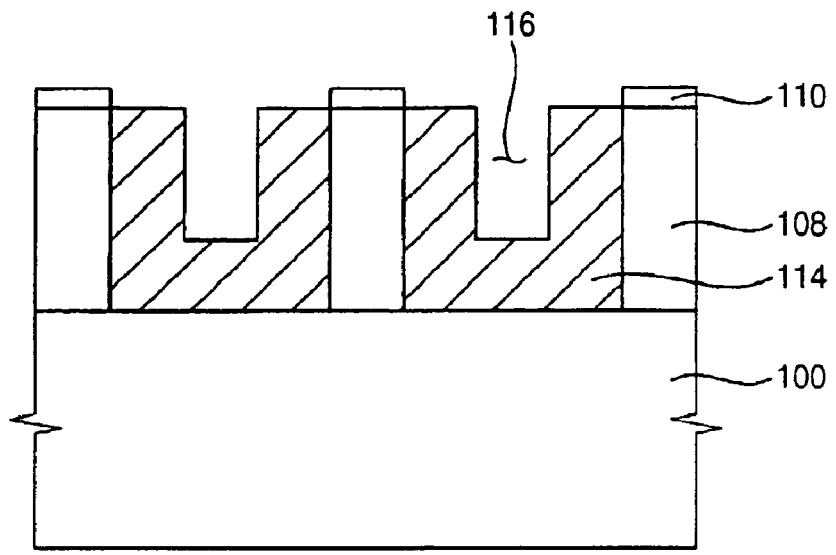

Referring to FIG. 5, an active pattern 114 may be formed on a bottom and a sidewall of the first hole 112 by performing a SEG process on the top surface of the semiconductor substrate 100 and a sidewall of the sacrificial layer pattern 108. In example embodiments, the semiconductor substrate 100 may be formed using single crystalline silicon, and thus the active pattern 114 may include single crystalline silicon. A second hole 116, which is formed by the active pattern 114 and has a width smaller than that of the first hole 112, may be formed within the first hole 112 while the SEG process is performed. In example embodiments, the active pattern 114 may be grown to such a degree that a ratio between a width of the second hole 116 and a thickness of the active pattern 114 may be about 1:1.

The SEG may mean that the active pattern 114 grows only on a portion of the first hole 112 including a predetermined or given material, e.g., silicon. In example embodiments, the active pattern 114 may grow on the top surface of the semiconductor substrate 100 exposed by the first hole 112 and the sidewall of the sacrificial layer pattern 108, both of which include silicon. The stop layer pattern 110 may cover a top surface of the sacrificial layer pattern 108 so that the active pattern 114 may not grow on and/or over the top surface of the sacrificial layer pattern 108.

The active pattern 114 may be formed only on the top surface of the semiconductor substrate 100 exposed by the first hole 112 and the sidewall of the sacrificial layer pattern 108. In example embodiments, the thickness of the active pattern 114 may be substantially the same as a width of the sacrificial layer pattern 108. A ratio between the thickness of the active pattern 114 and the width of the first hole 112 may be about 1:3.

Figure 6:
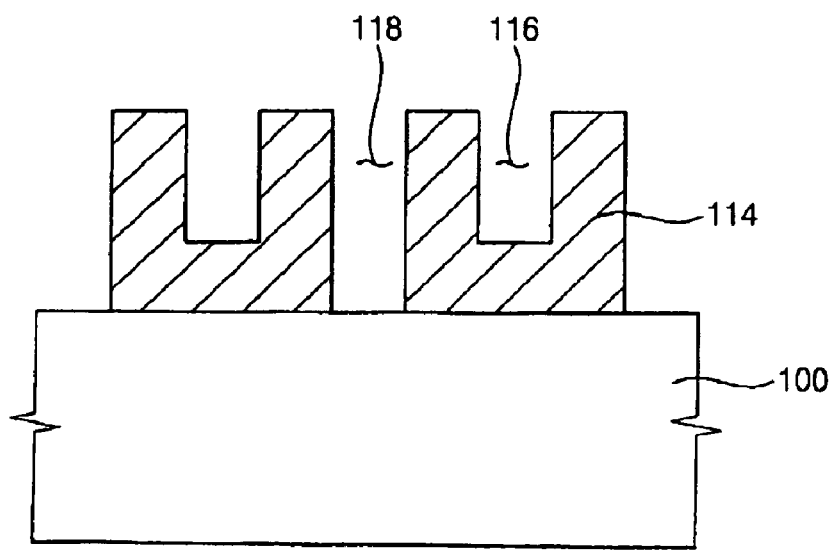

Referring to FIG. 6, the stop layer pattern 110 and the sacrificial layer pattern 108 may be removed from the semiconductor substrate 100. The active pattern 114 may be completed on the semiconductor substrate 100. In example embodiments, a plurality of the active patterns 114 may be formed on the semiconductor substrate 100. In some example embodiments, the active pattern 114 may serve as an active region in a fin field effect transistor (FET).

A process for removing the stop layer pattern 110 and the sacrificial layer pattern 108 may be performed as follows. As mentioned above, in example embodiments, the stop layer pattern 110 may include oxide and may be removed using a diluted solution of hydrogen fluoride (HF). The sacrificial layer pattern 108 may be removed using an etchant having an etching selectivity that may be between those of the sacrificial layer pattern 108 and the active patterns 114. For example, the etchant may include peracetic acid ($C_2H_4O_3$).

As described above, the sacrificial layer pattern 108 may be removed so that a third hole 118 may be formed to partially expose a top surface of the semiconductor substrate 100. In example embodiments, the third hole 118 may have a width substantially the same as that of the second hole 116. The third hole 118 may have a depth different from that of the second hole 116. The second hole 116 may have a depth smaller than that of the third hole 118 by the thickness of the active pattern 114 because the second hole 116 may be formed by growing the active pattern 114 on the semiconductor substrate 100. As shown in FIG. 6, a bottom of the third hole 118 may have a height different from that of a bottom of the second hole 116.

The active pattern 114 formed by the above-described method may have a finer size and an improved shape compared to a conventional active pattern formed by directly patterning layers using a photoresist pattern. The active pattern 114 may not have the problems generated when the conventional active pattern is formed. Furthermore, the active pattern 114 may be employed not only in a non-volatile memory device but also in a volatile memory device.

Figure 7:
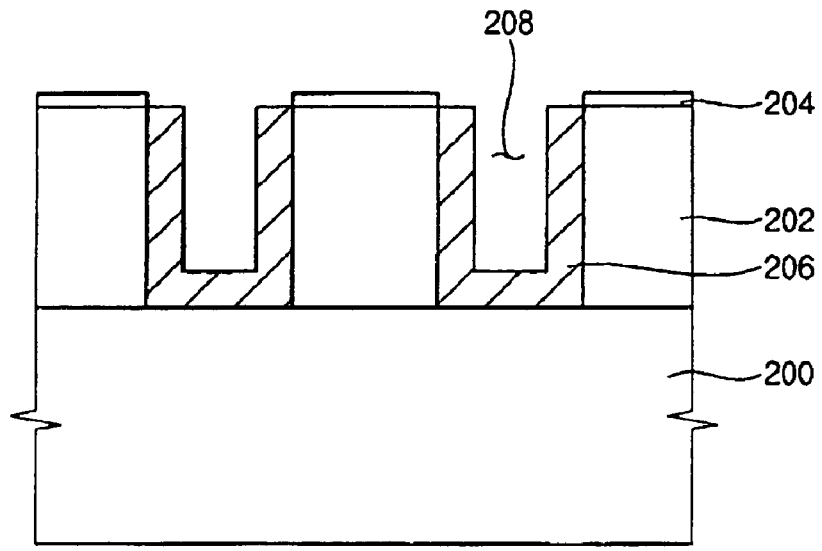

Hereinafter, a method of forming a pattern in accordance with other example embodiments will be explained in detail with reference to the accompanying drawings. FIGS. 7 to 10 are diagrams illustrating a method of forming a pattern in accordance with example embodiments. Referring to FIG. 7, processes substantially the same as and/or similar to the above processes illustrated with reference to FIGS. 1 to 4 may be performed, so that a sacrificial layer pattern 202 and a stop layer pattern 204 for preventing or reducing an epitaxial growth may be formed on a semiconductor substrate 200. The sacrificial layer pattern 202 may have a first hole (not shown) therethrough, which partially exposes a first top surface portion of the semiconductor substrate 200. In example embodiments, a ratio between a width of the first hole and that of the sacrificial layer pattern 202 may be about 1:1.

A first active layer 206 may be formed on a bottom and a sidewall of the first hole by performing a first SEG process on the first top surface portion of the semiconductor substrate 200 and a sidewall of the sacrificial layer pattern 202. In example embodiments, the semiconductor substrate 200 may be formed using single crystalline silicon, and thus the first active layer 206 may include single crystalline silicon. The first active layer 206 may not completely fill the first hole, and thus a second hole 208, which is formed by the first active layer 206 and has a width smaller than that of the first hole, may be formed within the first hole while the first SEG process is performed.

Figure 8:
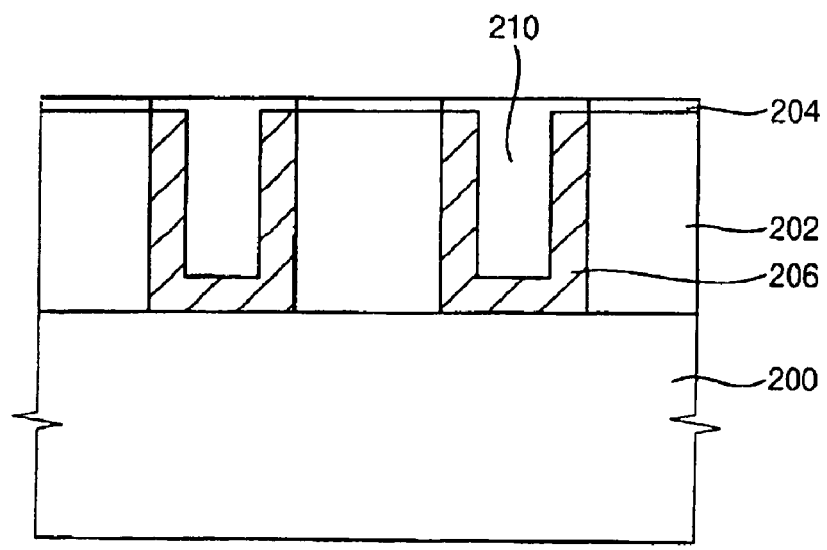

Referring to FIG. 8, an insulation layer pattern 210 may be formed on the semiconductor substrate 200 to sufficiently fill the second hole 208. An insulation layer (not shown) may be formed on the first active layer 206 and the stop layer pattern 204 to sufficiently fill the second hole 208. A top surface of the insulation layer may be planarized until a top surface of the stop layer pattern 204 is exposed by a chemical mechanical polishing (CMP) process, an etch-back process and/or a combination process of CMP and etch back to form the insulation layer pattern 210 on the first active layer 206. The insulation layer pattern 210 may have a cap-like shape so that a width of an upper portion of the insulation layer pattern 210 may be larger than that of a lower portion of the insulation layer pattern 210.

The insulation layer pattern 210 may be formed using a material having an etching selectivity with respect to the stop layer pattern 204. For example, when the stop layer pattern 204 includes a nitride, the insulation layer pattern 210 may include an oxide. Examples of the oxide may be undoped silicate glass (USG), ozone tetra ethyl ortho silicate USG ($O_3$-TEOS USG) and/or high density plasma (HDP) oxide.

Figure 9:
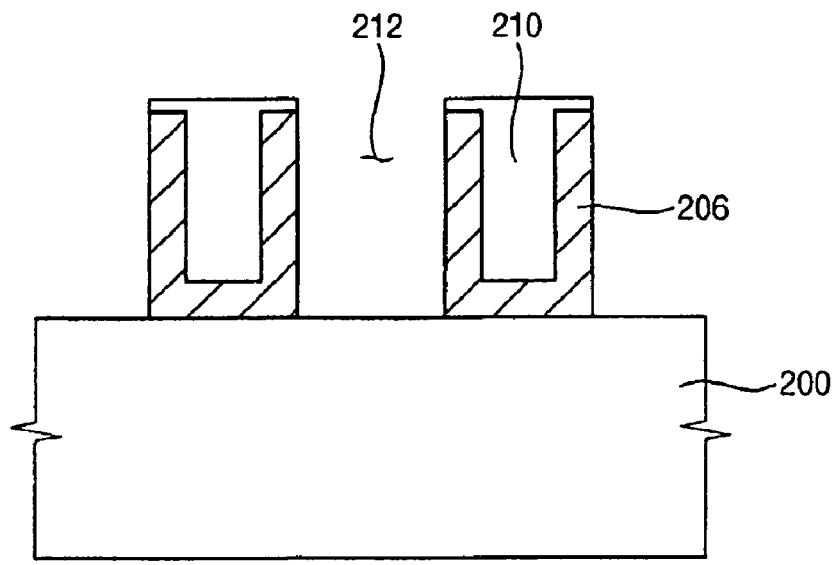

Referring to FIG. 9, the stop layer pattern 204 and the sacrificial layer pattern 202 may be removed from the semiconductor substrate 200. The stop layer pattern 204 and the sacrificial layer pattern 202 may be removed by substantially the same process as that for removing the stop layer pattern 110 and the sacrificial layer pattern 108 as illustrated with reference to FIG. 6. Detailed explanations for the process are omitted here to avoid redundancy. A third hole 212 may be formed by removing the stop layer pattern 204 and the sacrificial layer pattern 202 to partially expose a second top surface portion of the semiconductor substrate 200.

Figure 10:
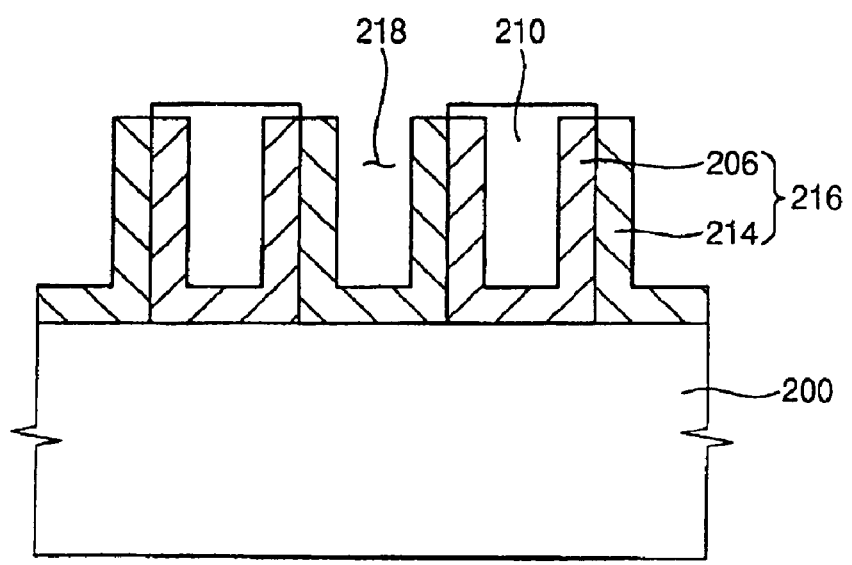

Referring to FIG. 10, a second active layer 214 may be formed on a bottom and a sidewall of the third hole 212 by performing a second SEG process on the second top surface portion of the semiconductor substrate 200 and a sidewall of the first active layer 206. In example embodiments, the second active layer 214 may be formed to have a thickness substantially the same as that of the first active layer 206. An active pattern 216 including the first and the second active layers 206 and 214 may be completed on the semiconductor substrate 200.

The second active layer 214 may have a fourth hole 218 thereon, which has a width smaller than that of the third hole 212. In example embodiments, a ratio between a width of the second hole 208 and that of the fourth hole 218 may be about 1:1, and a ratio between the width of the second hole 208 and that of the active pattern 216 may be about 1:1.

As shown in FIG. 10, the second hole 208 and the fourth hole 218 may have substantially the same depth. The second hole 208 may be formed by performing the first SEG process on the bottom and the sidewall of the first hole and the fourth hole 218 may be formed by performing the second SEG process on the bottom and the sidewall of the third hole 212. Accordingly, the second and the fourth holes 208 and 218 may have substantially the same depth because the first and the second active layers 206 and 214 formed by the first and the second SEG processes, respectively, may be formed on the top surface portions of the semiconductor substrate 200.

The active pattern 216 formed by the above-described method may have a finer size and an improved shape compared to a conventional active pattern formed by patterning layers using a photoresist pattern. The active pattern 216 may not have the problems generated when the conventional active pattern is formed. Furthermore, the active pattern 216 may be employed not only in a non-volatile memory device but also in a volatile memory device.

Figure 11:
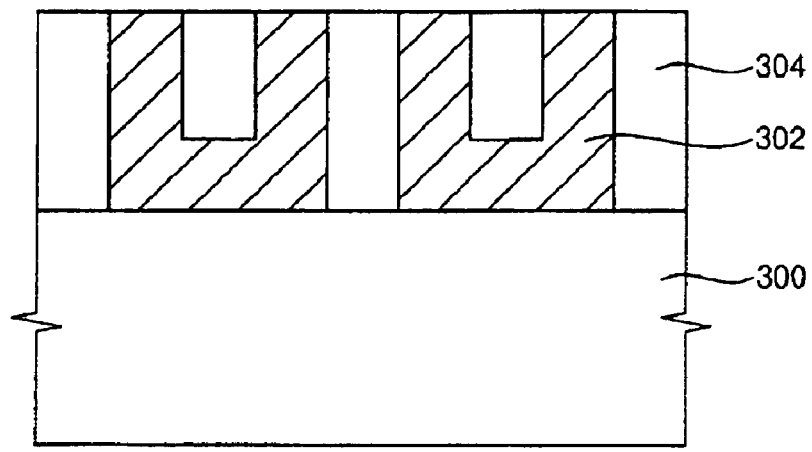
Figure 12:
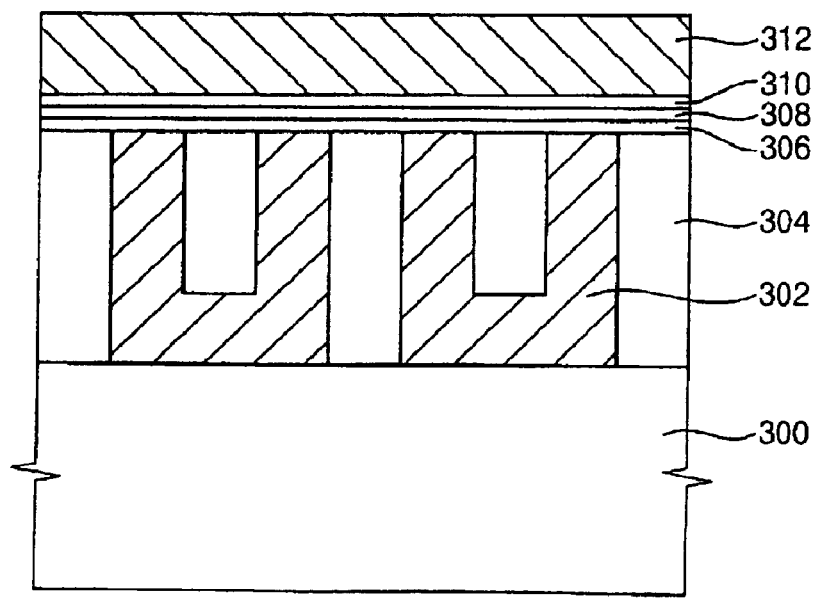

Hereinafter, a method of manufacturing a memory device in accordance with example embodiments will be explained in detail with reference to the accompanying drawings. A method of manufacturing a non-volatile memory device will be explained in detail, however, the method may be used in manufacturing a volatile memory device with modification and alteration within the spirit and scope of example embodiments. FIGS. 11 to 12 are diagrams illustrating a method of manufacturing a non-volatile memory device using the method of forming the pattern illustrated with reference to FIGS. 1 to 6.

Referring to FIG. 11, processes substantially the same as and/or similar to the above processes illustrated with reference to FIGS. 1 to 6 may be performed, thereby forming an active pattern 302 on a semiconductor substrate 300. In some example embodiments, the active pattern 302 may serve as an active region in a fin FET. In example embodiments, a plurality of the active patterns 302 may be formed on the semiconductor substrate 300. An insulation layer pattern 304 may be formed on the semiconductor substrate 300 to sufficiently fill spaces between the active patterns 302 and spaces formed by the active patterns 302 thereon.

An insulation layer (not shown) may be formed on the semiconductor substrate 300 to sufficiently fill the spaces between the active patterns 302 and the spaces formed by the active patterns 302 thereon. The insulation layer may be formed using an oxide (e.g., USG, $O_3$-TEOS USG and/or HDP oxide). In example embodiments, the insulation layer including HDP oxide may be formed by generating an HDP plasma using silane gas ($SiH_4$), oxygen gas ($O_2$) and argon gas (Ar) as plasma source gases.

An annealing process on the insulation layer may be performed at a temperature of about 800° C. to about 1050° C. under inert gas atmosphere to densify the insulation layer so that an etching ratio of the insulation layer in a successive etching process may be decreased. The insulation layer may be planarized until a top surface of the active pattern 302 is exposed to form the insulation layer pattern 304. The insulation layer may be planarized by a CMP process, an etch-back process and/or a combination process of CMP and etch back. The insulation layer pattern 304 may be formed between the active patterns 302, so that a fin-type active region and a field region may be defined in the semiconductor substrate 300.

Referring to FIG. 12, a tunnel oxide layer 306, a charge trapping layer 308, a blocking insulation layer 310 and a gate conductive layer 312 may be formed on the semiconductor substrate 300 on which the active pattern 302 and the insulation layer pattern 304 are formed. The tunnel oxide layer 306 may be formed on the active pattern 302 and the insulation layer pattern 304. The tunnel oxide layer 306 may be formed using silicon oxide ($SiO_2$), aluminum oxide (AlO) and/or silicon oxynitride (SiON). The tunnel oxide layer 306 may be formed by a thermal oxidation process, a CVD process, a physical vapor deposition (PVD) process and/or a combination process thereof.

The charge trapping layer 308 may be formed on the tunnel oxide layer 306. In example embodiments, the charge trapping layer 308 may be formed using silicon nitride (SiN). The charge trapping layer 308 may be formed by a CVD process, a PVD process and/or a combination process of CVD and PVD. The blocking insulation layer 310 may be formed on the charge trapping layer 308. The blocking insulation layer 310 may be formed using silicon oxide, aluminum oxide and/or silicon oxynitride. The blocking insulation layer 310 may be formed by a thermal oxidation process, a CVD process, a PVD process and/or a combination process thereof.

The gate conductive layer 312 may be formed on the blocking insulation layer 310. The gate conductive layer 312 may be formed using polysilicon, metal and/or metal nitride. The gate conductive layer 312 may be formed by a CVD process, a PVD process and/or a combination process of CVD and PVD. A mask pattern (not shown) may be formed on the gate conductive layer 312 to extend in a direction substantially perpendicular to a direction in which the active pattern 302 extends. The gate conductive layer 312, the blocking insulation layer 310, the charge trapping layer 308 and the tunnel oxide layer 306 may be partially removed by an etching process using the mask pattern as an etching mask to form a tunnel oxide layer pattern, a charge trapping layer pattern, a blocking insulation layer pattern and a gate electrode on the active pattern 302 and the insulation layer pattern 304.

Impurities may be implanted onto a top surface portion of the active pattern 302 using the gate electrode as an implantation mask to form a source region (not shown) and a drain region (not shown) in the active pattern 302. A non-volatile memory device including the tunnel oxide layer pattern, the charge trapping layer pattern, the blocking insulation layer pattern, the gate electrode and the source/drain region may be completed on the semiconductor substrate 300.

Hereinafter, a method of manufacturing a memory device in accordance with example embodiments will be explained in detail with reference to the accompanying drawings. A method of manufacturing a non-volatile memory device will be explained in detail, however, the method may be used in manufacturing a volatile memory device with modification and alteration within the spirit and scope of example embodiments.

Figure 13:
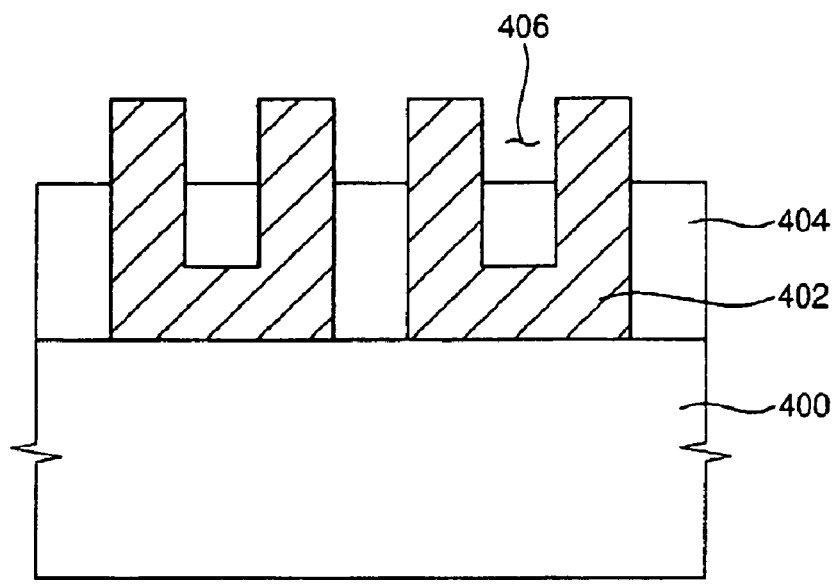
Figure 14:
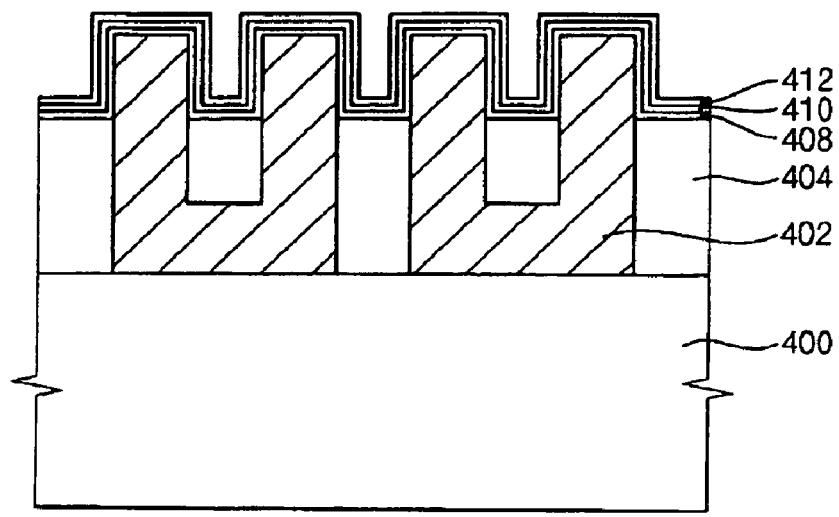
Figure 15:
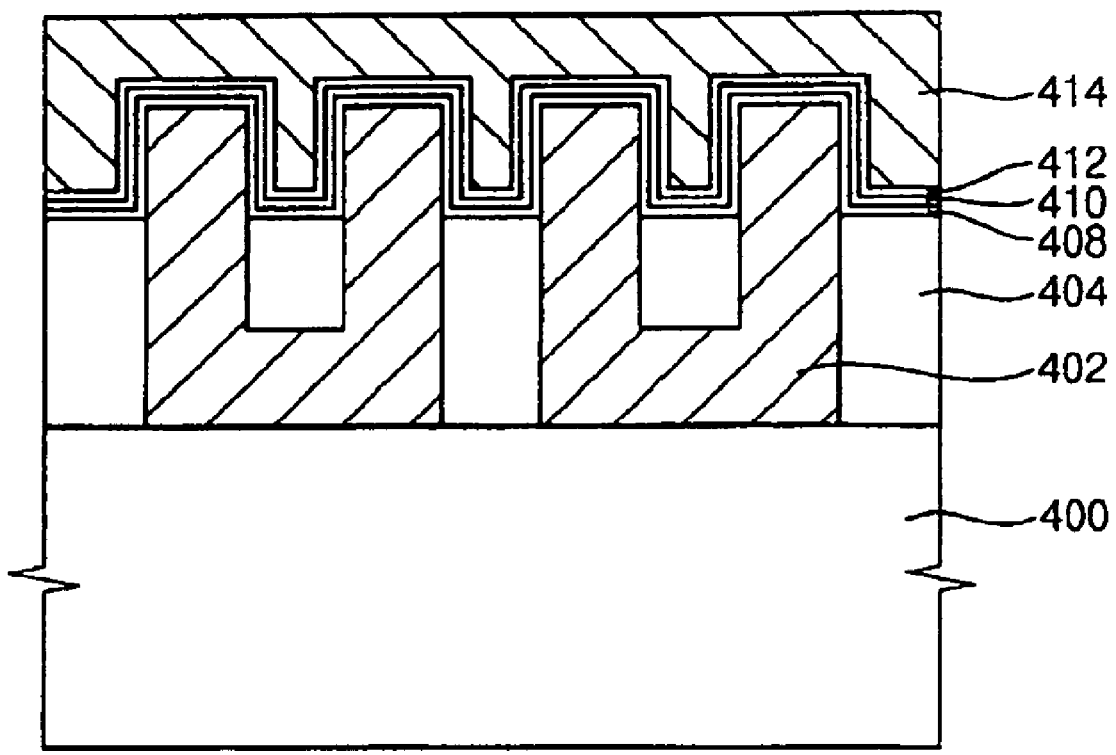

FIGS. 13 to 15 are diagrams illustrating a method of manufacturing a non-volatile memory device using the method of forming the pattern illustrated with reference to FIGS. 1 to 6. Referring to FIG. 13, processes substantially the same as and/or similar to the above processes illustrated with reference to FIGS. 1 to 6 may be performed, so that an active pattern 402 may be formed on a semiconductor substrate 400. Alternatively, processes substantially the same as and/or similar to the above processes illustrated with reference to FIGS. 7 to 10 may be performed, so that the active pattern 402 may be formed on the semiconductor substrate 400. In example embodiments, the active pattern 402 may serve as an active region in a fin FET.

In example embodiments, a plurality of the active patterns 402 may be formed on the semiconductor substrate 400. An insulation layer pattern 404 may be formed on the semiconductor substrate 400 to fill spaces between the active patterns 402 and spaces formed by the active patterns 402 thereon. An insulation layer (not shown) may be formed on the semiconductor substrate 400 to sufficiently fill the spaces between the active patterns 402 and the spaces formed by the active patterns 402 thereon. The insulation layer may be formed using an oxide (e.g., USG, $O_3$-TEOS USG and/or HDP oxide).

In example embodiments, the insulation layer including HDP oxide may be formed by generating an HDP plasma using silane gas ($SiH_4$), oxygen gas ($O_2$) and argon gas (Ar) as plasma source gases. An annealing process on the insulation layer may be performed at a temperature of about 800° C. to about 1050° C. under inert gas atmosphere to densify the insulation layer, so that an etching ratio of the insulation layer in a successive etching process may be decreased. The insulation layer may be planarized until a top surface of the active pattern 402 is exposed to form a preliminary insulation layer pattern (not shown).

A top surface of the preliminary insulation layer pattern may be partially removed by an etching process to form the insulation layer pattern 404, and thus a hole 406 may be formed to expose a top surface of the insulation layer pattern 404, which is disposed on the active pattern 402. The active pattern 402 and the insulation layer pattern 404 may be completed on the semiconductor substrate 400, the active pattern 402 may serve as an active region, and the insulation layer pattern 404 may serve as a field region.

Referring to FIG. 14, a tunnel oxide layer 408, a charge trapping layer 410 and a blocking insulation layer 412 may be formed on the active pattern 402 and the insulation layer pattern 404. The tunnel oxide layer 408, the charge trapping layer 410 and the blocking insulation layer 412 may not completely fill the hole 406 as shown in FIG. 14. The tunnel oxide layer 408, the charge trapping layer 410 and the blocking insulation layer 412 may be formed by a process substantially the same as and/or similar to the process illustrated with reference to FIG. 13.

Referring to FIG. 15, a gate conductive layer 414 may be formed on the blocking insulation layer 412 to sufficiently fill the hole 406. The gate conductive layer 414 may be formed using polysilicon, metal and/or metal nitride. The gate conductive layer 414 may be formed by a CVD process, a PVD process and/or a combination process of CVD and PVD.

A mask pattern (not shown) may be formed on the gate conductive layer 414 to extend in a direction substantially perpendicular to a direction in which the active pattern 402 extends. The gate conductive layer 414, the blocking insulation layer 412, the charge trapping layer 410 and the tunnel oxide layer 408 may be partially removed by an etching process using the mask pattern as an etching mask to form a memory cell including a tunnel oxide layer pattern, a charge trapping layer pattern, a blocking insulation layer pattern and a gate electrode on the active pattern 402 and the insulation layer pattern 404.

Impurities may be implanted onto a top surface portion of the active pattern 402 using the memory cell as an implantation mask to form a source region (not shown) and a drain region (not shown) in the active pattern 402. A non-volatile memory device may be completed on the semiconductor substrate 400. According to example embodiments, an active pattern formed by a SEG process may have a finer size and an improved shape compared to a conventional active pattern formed by directly patterning layers using a photoresist pattern. Damages in a photolithography process may be prevented or reduced from being generated, thereby increasing a reliability of a memory device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific example embodiments disclosed, and that modifications to the disclosed example embodiments, as well as other example embodiments, are intended to be included within the scope of the appended claims. Example embodiments are defined by the following claims, with equivalents of the claims to be included therein.

What is claimed is:

1. A method of forming a pattern, the method comprising:
    forming a sacrificial layer pattern and a stop layer pattern for reducing an epitaxial growth on a substrate, wherein the sacrificial layer pattern includes a first hole therethrough, and wherein the first hole partially exposes a first top surface portion of the substrate;
    forming a first active layer on a bottom and a sidewall of the first hole by performing a first SEG process on the first top surface portion of the substrate and a sidewall of the sacrificial layer pattern, wherein a second hole is formed within the first hole while the SEG process is performed and has a width smaller than that of the first hole;
    forming an insulation layer pattern to sufficiently fill the second hole;
    forming a third hole by removing the sacrificial layer pattern and the stop layer pattern for reducing the epitaxial growth; and
    forming a second active layer on a bottom and a sidewall of the third hole by performing a second SEG process on a second top surface portion of the substrate and a sidewall of the first active layer to form at least one active pattern including the first and the second active layers, wherein the second top surface portion of the substrate is exposed by the third hole.

2. The method of claim 1, wherein the substrate includes single crystalline silicon and the active pattern includes single crystalline silicon.

3. The method of claim 1, wherein a ratio between a width of the first hole and that of the sacrificial layer pattern is about 1:1.

4. The method of claim 1, wherein a ratio between a width of the second hole and that of the at least one active pattern is about 1:1.

5. The method of claim 1, wherein forming the stop layer pattern includes forming the stop layer pattern using an oxide or a nitride.

6. The method of claim 1, wherein forming the insulation layer pattern comprises:
   forming an insulation layer on the stop layer pattern and the first active layer to sufficiently fill the second hole; and
   planarizing the insulation layer until a top surface of the stop layer pattern is exposed.

7. The method of claim 1, wherein the insulation layer pattern is a first insulation layer pattern and the at least one active pattern is a plurality of active patterns, further comprising:
   forming a second insulation layer pattern on the substrate to fill spaces between the plurality of active patterns; and
   forming a tunnel oxide layer, a charge trapping layer, a blocking insulation layer and a gate conductive layer on the plurality of active patterns and the first and the second insulation layer patterns.

8. The method of claim 7, after forming the second insulation layer pattern, further comprising:
   partially removing the second insulation layer pattern to expose top surfaces of the plurality of active patterns.

9. The method of claim 7, further comprising:
   forming a mask pattern on the gate conductive layer, the mask pattern extending in a direction substantially perpendicular to a direction in which the plurality of active patterns extend;
   partially removing the gate conductive layer, the blocking insulation layer, the charge trapping layer and the tunnel oxide layer by an etching process using the mask pattern as an etching mask to form a memory cell on the plurality of active patterns and the first and the second insulation layer patterns; and
   implanting impurities onto top surface portions of the plurality of active patterns using the gate electrode as an implantation mask to form a source region and a drain region in the plurality of active patterns.

* * * * *